United States Patent [19]

Watanabe et al.

[11] Patent Number: 5,429,711
[45] Date of Patent: Jul. 4, 1995

[54] METHOD FOR MANUFACTURING WAFER

[75] Inventors: Mineo Watanabe; Hitoshi Harada; Masanori Takemura, all of Tokyo, Japan

[73] Assignees: Mitsubishi Materials Corporation; Mitsubishi Materials Silicon Corporation, both of Japan

[21] Appl. No.: 104,323

[22] Filed: Aug. 9, 1993

[30] Foreign Application Priority Data

Sep. 18, 1992 [JP] Japan .................. 4-250126

[51] Int. Cl.⁶ ............................. H01L 21/00
[52] U.S. Cl. .................... 216/52; 437/225; 216/89; 216/99
[58] Field of Search ............ 437/225; 156/662, 645, 156/636, 635, 650

[56] References Cited

U.S. PATENT DOCUMENTS 4,412,886 11/1983 Sakaguchi et al. ............. 156/645
5,071,776 12/1991 Matsushita et al. ............. 437/10
5,254,502 10/1993 Kozlovsky ...................... 437/225

FOREIGN PATENT DOCUMENTS 0319805  6/1989  European Pat. Off. .
0348757  1/1990  European Pat. Off. .
  588055  3/1994  European Pat. Off. .
01268032 10/1989 Japan .

OTHER PUBLICATIONS

Patent Abstracts of Japan, vol. 8, No. 176 (E-260) Aug. 14, 1994 & JP-A-59072139, Apr. 24, 1994.
Patent Abstracts of Japan, vol. 12, No. 27 (M-662) Jan. 27, 1988 & JP-A-62181869, Aug. 10, 1987.
Patent Abstracts of Japan, vol. 12, No. 63 (E-585) Feb. 25, 1988 & JP-A62204535, Sep. 9, 1987.
Patent Abstracts of Japan, vol. 16, No. 385 (E-1249) Aug. 17, 1992 & JP-A-04124823, Apr. 24, 1992.

Primary Examiner—R. Bruce Breneman
Assistant Examiner—George Goudreau
Attorney, Agent, or Firm—Scully, Scott, Murphy & Presser

[57] ABSTRACT

There is disclosed a wafer-manufacturing method in which a single crystal ingot is first sliced into a plurality of wafers, and both surfaces of each wafer are subjected to grinding or lapping operation. Then, the front and back surfaces of the wafer are subjected to etching. Thereafter, the back surface of the wafer is subjected to chemical mechanical polishing to half-polish the same, following which the wafer is placed on a polishing machine, with the half-polished back surface of the wafer being adhered to a carrier plate; and the front surface of the wafer is mirror-polished. In the foregoing, a polysilicon film for extrinsic gettering may be formed on the back surface of the etched wafer prior to the half-polishing.

5 Claims, 9 Drawing Sheets

Ra : 0.31 μm
Rmax : 2.22 μm
Rz : 1.81 μm
Rt : 2.22 μm

Ra : 0.16 μm
Rmax : 1.49 μm
Rz : 1.19 μm
Rt : 1.54 μm

Ra :   0.23 μm
Rmax : 2.37 μm
Rz :   1.46 μm
Rt :   2.35 μm

RA :   0.19 μm
Rmax : 1.50 μm
Rz :   1.28 μm
Rt :   1.40 μm ( 1ST EMBODIMENT )

STIR : μm

FIG.10

(2ND EMBODIMENT)

|      |      |      | 0.15 | 0.14 | 0.13 | 0.18 |      |      |      |
|------|------|------|------|------|------|------|------|------|------|
|      |      | 0.12 | 0.17 | 0.21 | 0.25 | 0.27 | 0.21 |      |      |
|      | 0.15 | 0.18 | 0.18 | 0.16 | 0.25 | 0.26 | 0.32 | 0.21 |      |
| 0.17 | 0.19 | 0.17 | 0.12 | 0.07 | 0.16 | 0.20 | 0.22 | 0.26 | 0.13 |
| 0.19 | 0.23 | 0.23 | 0.25 | 0.18 | 0.18 | 0.24 | 0.23 | 0.27 | 0.13 |
| 0.22 | 0.29 | 0.29 | 0.25 | 0.12 | 0.07 | 0.20 | 0.26 | 0.33 | 0.12 |
| 0.18 | 0.25 | 0.26 | 0.17 | 0.14 | 0.07 | 0.18 | 0.26 | 0.25 | 0.12 |
|      | 0.16 | 0.25 | 0.19 | 0.13 | 0.05 | 0.14 | 0.25 | 0.24 |      |
|      |      | 0.24 | 0.17 | 0.12 | 0.03 | 0.10 | 0.26 |      |      |
|      |      |      | 0.23 | 0.08 | 0.04 | 0.34 |      |      |      |

STIR : $\mu$m

FIG.11

( COMPARATIVE EXAMPLE )

|      |      |      | 0.33 | 0.25 | 0.23 | 0.21 |      |      |      |
|------|------|------|------|------|------|------|------|------|------|
|      |      | 0.30 | 0.29 | 0.33 | 0.38 | 0.30 | 0.21 |      |      |
|      | 0.33 | 0.30 | 0.34 | 0.41 | 0.45 | 0.45 | 0.41 | 0.36 |      |
| 0.39 | 0.36 | 0.33 | 0.38 | 0.45 | 0.51 | 0.43 | 0.44 | 0.39 | 0.47 |
| 0.65 | 0.40 | 0.36 | 0.31 | 0.31 | 0.44 | 0.42 | 0.39 | 0.40 | 0.55 |
| 0.81 | 0.38 | 0.34 | 0.30 | 0.43 | 0.60 | 0.43 | 0.40 | 0.39 | 0.36 |
| 0.54 | 0.46 | 0.34 | 0.33 | 0.26 | 0.30 | 0.41 | 0.39 | 0.45 | 0.43 |
|      | 0.53 | 0.40 | 0.34 | 0.32 | 0.39 | 0.41 | 0.45 | 0.61 |      |
|      |      | 0.64 | 0.35 | 0.29 | 0.30 | 0.45 | 0.63 |      |      |
|      |      |      | 0.66 | 0.22 | 0.21 | 0.48 |      |      |      |

STIR : $\mu$m ( COMPARATIVE EXAMPLE )

STIR : μm

METHOD FOR MANUFACTURING WAFER

BACKGROUND OF THE INVENTION

The present invention pertains to a method for manufacturing a large-diameter wafer In which the required flatness of the surface of the wafer must be less than 0.5 micron rule in order to be useful in the manufacture of ULSIs (Ultra Large Scale Integrated Circuits), and in particular, to a method for manufacturing such a wafer which is provided with a polysilicon film for extrinsic gettering.

The requirements of typical half-micron rule ULSIs, for example, for 16M DRAM (Dynamic Random Access Memory), are large wafer diameter and extreme flatness. Wafers must be at least 200 mm in diameter, and the flatness thereof must meet the requirements of photolithography.

However, it has been found that in conventional wafer manufacturing methods, it is difficult to obtain sufficient flatness of the wafer. Namely, in the manufacture of wafers 200 mm or more in diameter, the requirements of the flatnesses of the wafers are very strict compared with those for the manufacture of wafers of smaller diameters. In particular, when a photolithographic process is utilized, the smaller the line width rule, the shwallower the depth of focus becomes. Therefore, as the line width of an exposure is reduced, the flatness requirements increase. For instance, 16M devices have been produced using a tilting mechanism requiring a local flatness of less than 0.5 $\mu$m in a 25 mm$\times$25 mm area of the front wafer surface. Of course, higher global flatness and total flatness (back surface reference flatness) are also required.

To meet these requirements, it is particularly important to improve the polishing process during wafer manufacture. For example, Japanese Patent Application, Laid-Open No. 5-152262, discloses a wax-mount process in which large carrier plates of higher flatness are utilized to adhere wafers to be polished. The process is conducted in a higher grade cleanroom, and special care is taken to clean carrier plates and wafers to reduce the number of particles sandwiched between the carrier plate and the wafer in the wax. Additionally, wax thickness is reduced to improve flatness.

It is well-known that the particles sandwiched between the carrier plate and the wafer in the wax are the cause of "dimples" on the front surface of the wafer after demounting from the carrier plates. A dimple is a shallow depression with gently sloping sides that exhibits a concave, spheroidal shape, and these dimples are often overlooked during unaided visual inspection, and the presence of these dimples reduces the degree of flatness of chips for 16M. However, such defects may be easily detected using Makyo (parallel beam reflection image).

Unfortunately, the aforesaid process cannot eliminate dimple defects. By reducing the wax thickness to improve flatness, protrusions and ripples on the back surface cause dimple and wave defects on the front surface. Protrusions on the back surface are the locations at which adhered particles are protected from being etched-off during etching processing, and ripples result because etching processings cannot be performed uniformly over the entire surface although many attempts have been made, for example, by rotating wafers in the etching solution.

Further attempts at improvement of the etching process have been unsuccessful, but the inventors have resolved the aforesaid problems by developing a half-polishing method which involves removing protrusions and half-cutting peaks of ripples by polishing to improve flatness of back surface.

Furthermore, when a wafer is provided with a polysilicon film for extrinsic gettering, it is inevitable that so-called "mound" defects are created by particles or flakes falling on the wafers during the polysilicon CVD (Chemical Vapor Deposition) process, and also that irregularities of film thickness result due to irregularity of gas flow and ripples on the wafer surface. When wax-mounting a wafer with CVD polysilicon film and then polishing, irregularities on the back surface cause defects on the front surface, such as dimples and waves, and thereby deteriorate flatness. Therefore, by the half-polishing technique which involves eliminating mounds and cutting peaks of the ripples In a degree not exceeding the film thickness so as not to expose the inner wafer, a flatter back surface is obtained. The half-polishing step involves partially polishing the back surface of a wafer to an incomplete mirror polished finish. By wax-mounting and polishing the above half-polished wafer, excellent flatness can be obtained.

Another effect of half-polishing the back surface of a wafer, in particular, a wafer with polysilicon film, is a noticeable decrease of particles during the succeeding process and during wafer transportation. This effect is supposed to reduce the breakage of protrusions or mounds and also reduce the peeling off of peaks of ripples or films by smoothing the back surface of the wafer. It is obvious that these effects are similar in the device manufacturing process.

The same effects appear in wafers polished on both sides (both sides polished simultaneously by a double side polishing machine). However, a wafer polished on both sides is not used because the back surface easily becomes dirty or scratched. Recently, it has been discovered that the contaminants adhering to the back surface are harmful when they migrate to the front surface and degrade submicron devices. Furthermore, misalignment of the back surface which may occur because it is difficult to distinguish the front surface from the back surface, may be overcome by optically distinguishing the mark on the front surface. It is therefore necessary to procure wafers polished on both sides.

However, important disadvantages appear during the photolithography process. It is obvious that the flatness of the vacuum chuck must be improved in order for highly integrated circuits to be sufficiently flat on the front surface to satisfy a shallow focus. Consequently, extremely flat surfaces are in contact with each other, strong adhesion occurs due to van der Waals forces, and it often happens that air cannot be completely eliminated, resulting in the formation of air bubbles between the chuck and the back surface. On the front surface, mounds appear above the location of air bubbles and deteriorate flatness in a manner similar to that when wafer flatness is poor. Furthermore, it becomes difficult to dismount the wafer from the vacuum chuck. To overcome these difficulties, it is necessary to construct complicated chuck structures having many vacuum holes and to slowly remove air from the inner portion to the outer portion. This considerably reduces the throughput of device production.

In contrast, a wafer provided with a half-polished back surface is almost of the same reflectivity as one having an etched surface, and is easily distinguished by the unaided eye. During lithography, the half-polished back surface is similar to an as-etched back surface because the troughs of the ripples function as conduits to allow the passage of air. There are therefore no difficulties during vacuum chucking and removal from the chucking. In view of the above, a wafer having a half-polished back surface has advantages similar to those of a wafer polished on both sides.

SUMMARY OF THE INVENTION

It is therefore a primary object of the present invention to provide a method for manufacturing a wafer which reduces not only the occurrence of the dimple defects on the surface of the wafer but also the generation of the debris particles after the polishing step, and which further reduces wave defects on a Makyo level.

According to the invention, there is provided a method for manufacturing a wafer, comprising the steps of:
- (a) slicing a single crystal ingot into a plurality of wafers each having front and back surfaces, and subjecting the front and back surfaces of each wafer to one of grinding operation or lapping operation;
- (b) subsequently subjecting the front and back surfaces of the wafer to etching;
- (c) subsequently subjecting the back surface of the wafer to chemical mechanical polishing to half-polish the same; and
- (d) thereafter, placing the wafer on a polishing device, with the half-polished back surface being adhered to a carrier table of the polishing device, and subjecting the front surface of the wafer to mirror polishing.

As described previously, the chemical mechanical polishing process which achieves half-polishing involves removing protrusions and half-cutting peaks of ripples to improve flatness of back surface. With this chemical mechanical polishing of the back surface of the wafer, the dimple defects on the surface of the wafer are reduced and the generation of the debris particles after the polishing step can be reduced. Furthermore, waves on a Makyo level can also be avoided.

In the foregoing, a wafer may be provided with a polysilicon film for extrinsic gettering. Even in this case, with the half-polishing which involves eliminating mounds and cutting peaks of the ripples in a degree not exceeding the film thickness so as not to expose the inner wafer, the mound defects that may be created by particles or flakes falling on the wafers during the polysilicon CVD process, as well as irregularities of film thickness occurring due to irregularity of gas flow and ripples on the wafer surface can be avoided. Hence, by wax-mounting and polishing the above half-polished wafer, excellent flatness can be obtained.

Furthermore, due to the half-polishing of the back surface of a wafer, in particular, a wafer with polysilicon film, the generation of debris particles can be substantially reduced, thereby reducing the breakage of protrusions or mounds and also reducing the peeling off of peaks of ripples or films by smoothing the back surface of the wafer.

In addition, the wafer provided with a half-polished back surface is almost of the same reflectivity as one having an etched surface, and is easily distinguished by the unaided eye. During lithography, the half-polished back surface is similar to an as-etched back surface because the troughs of the ripples function as conduits to allow the passage of air. There are therefore no difficulties during vacuum chucking and removal from the chucking.

As described above, with the present method, not only the occurrence of the dimple defects on the surface of the wafer but also the generation of the debris particles after the polishing step can be reduced, and wave defects on a Makyo level can also be reduced.

BRIEF DESCRIPTION OF THE DRAWINGS

FIG. 10 is a view similar to FIG. 9, but showing the experimental result in the example corresponding to the second embodiment of the invention, showing the measurement of flatness by STIR on the half-polished wafer surface;

FIG. 11 is a view similar to FIG. 9, but showing the experimental result in a comparative example, showing the measurement of flatness by STIR on the etched back surface.

DESCRIPTION OF THE PREFERRED EMBODIMENTS OF THE INVENTION

Figure 1:
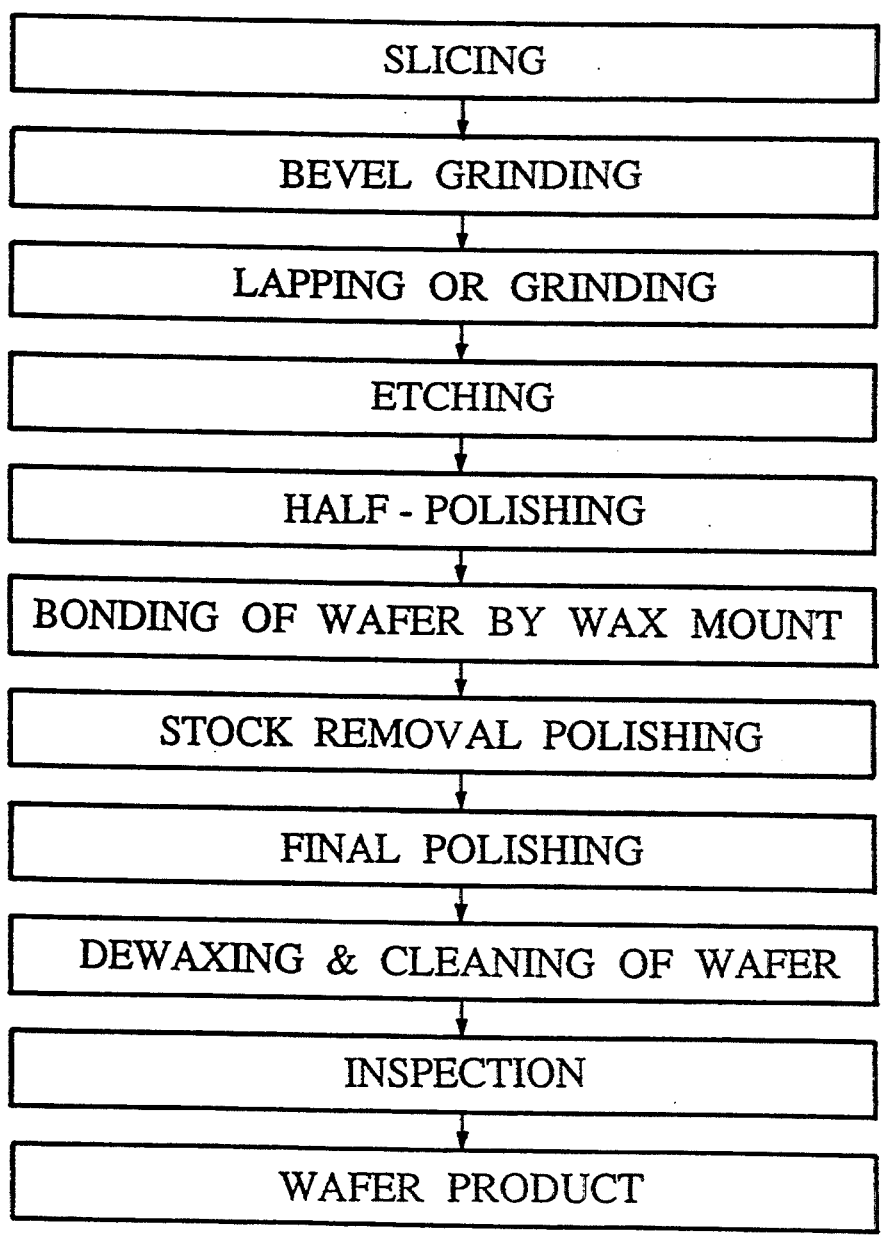
FIG. 1 is a flow diagram showing a method for manufacturing a wafer in accordance with a first embodiment of the present invention.

FIG. 1 is a flow diagram showing a wafer manufacturing method, in accordance with a first embodiment of the present invention.

In this method, a silicon single crystal ingot of a cylindrical shape is sliced into thin disc-shaped wafers, and the periphery of each wafer is subjected to bevel grinding. The wafer is then placed on a lapping machine, and both surfaces thereof are lapped with loose abrasive particles. Thereafter, the wafer is immersed in an etchant to remove damaged layers caused on its both surfaces during the lapping or grinding operations. The etching amount at this time is set to such a thickness that the damaged layers on the both surfaces of the wafer can be completely removed, that is, usually to about 20 $\mu$m for each side. With this etching, the surface roughness of the wafer becomes 0.3 to 0.35 $\mu$m in Ra (average roughness), and 2 to 3 $\mu$m in Rmax (maximum roughness).

Subsequently, the wafer is fixedly placed on an upper polishing plate of a single wafer polishing machine, and a polishing pad fixedly secured to a lower polishing plate is brought into abutment with the back surface of the wafer W. The polishing plates are then rotated relative to each other while supplying an alkaline polishing liquid containing fine polishing particles such as colloidal silica ($SiO_2$) to carry out a chemical mechanical polishing to half-polish the back surface of the wafer.

In the polishing machine, a foaming resin sheet of 1 mm thick is provided beneath the polishing pad so that the wafer is cushioned in an increased amount compared with the case where the polishing pad is directly secured to the upper surface of the lower polishing plate. With this construction, the protrusions on the wafer are strongly pressed by the polishing pad to facilitate the chemical mechanical reaction so that the protrusions are preferentially removed by polishing without removing the columnar crystalline polysilicon which has greater gettering effect. Accordingly, the abnormal protrusions which are susceptible to chemical mechanical polishing are pressed by the polishing pad and removed by polishing.

With respect to the average amount of removal $T_1$ of the back surface of the wafer at the half-polishing work, around 0.01 to 0.2 $\mu$m are enough. With this construction, the average roughness Ra reduces to about a half, and the maximum roughness Rmax reduces to 2/3. Below 0.01 $\mu$m, the back surface contour is transferred to the front surface, and a wave defect is formed thereon. On the other hand, if the average amount of removal exceeds 0.2 $\mu$m, even the recesses on the etched surface are polished.

Figure 2A:
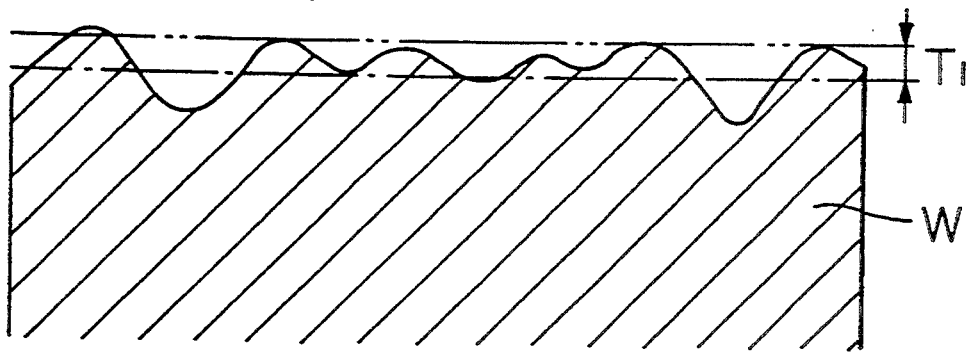
FIG. 2(A) is a schematic cross-sectional view showing a back surface of an etched wafer.
Figure 2B:
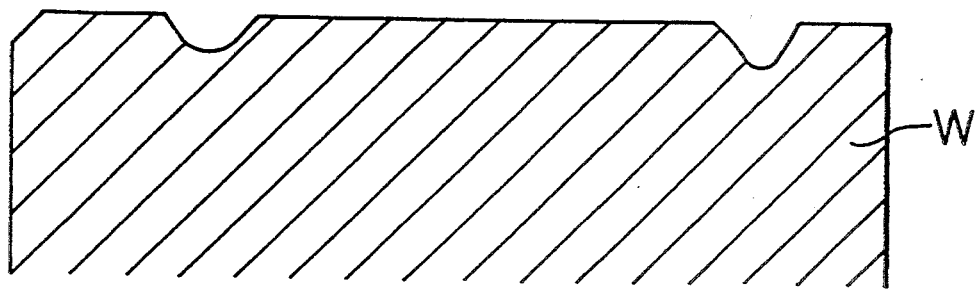
FIG. 2(B) is a view similar to FIG. 2(A), but showing the back surface of the wafer after the removal of ditches by a half-polishing treatment.

It is preferable that the abutting pressure against the polishing pad, pH concentration of the polishing liquid, and the average particle size of the polishing particles be about 50 to 400 gf/cm$^2$, 10 to 11, and about 0.01 to 0.02 $\mu$m respectively. If any one of the above parameters falls outside the respective range, the polishing irregularity and abnormal protrusions on the back surface of the water are crushed to produce particles, resulting in the occurrence of scratches. FIG. 2(A) is an enlarged cross-sectional view showing the back surface of the etched wafer W, whereas FIG. 2(B) is an enlarged cross-sectional view of the back surface of the wafer W, at a time of completion of the half-polishing work. As will be seen from FIG. 2(B), in the case where the half-polishing is carried out, dimples are not identified.

Subsequently, the back surface of the wafer made flat by the half-polishing is bonded to the carrier plate of the polishing machine by adhesive such as wax. Then, the carrier plate is set on the polishing machine, and as is the case with the conventional method, mirror polishing operations (stock removal-polishing and final polishing operations) are carried out. More specifically, the surface of the wafer which is secured to the carrier plate is brought into abutting contact with the polishing pad secured to the other polishing plate. Then, while supplying the alkaline polishing liquid containing minute polishing particles such as $SiO_2$ particles, the polishing plates are rotated relative to each other to carry out the polishing.

After the final polishing is thus completed, the wafer is removed from the carrier plate, and after being dewaxed, cleaned and dried, the wafer is subjected to a prescribed quality inspection to obtain a wafer product.

According to the wafer-manufacturing method as described above, the dimples are prevented from occurring on the surface of the wafer during the mirror polishing operation by removing the protrusions on the back surface of the wafer by the half-polishing work, so that the flatness of the wafer can be enhanced over the entire surface thereof. Furthermore, since the wafer is secured to the carrier plate with the flattened back surface being secured to the carrier plate through wax for mirror-polishing, the flatness of the wafer is further improved. In addition, since the back surface is made flat, vacuum chucking in a flatness-inspecting instrument becomes stable. Moreover, the wave, which is recognized on the surface by a Makyo observation, can be avoided by removing the protrusions of the polysilicon film as well as the ripples, resembling a peak and valley, existing during the etching.

When the protrusions on the back surface of the wafer are removed, those portions of the protrusions where many granular crystals which tend to peel off to produce particles during the conveyance of the wafers are developed, are removed, and hence the proportion defective in the device process stemming from the occurrence of particles can be reduced. Accordingly, rigid requirements for the manufacture of the devices can be attained even in the manufacture of the wafers of a large size such as 200 mm wafers.

Figure 4A:
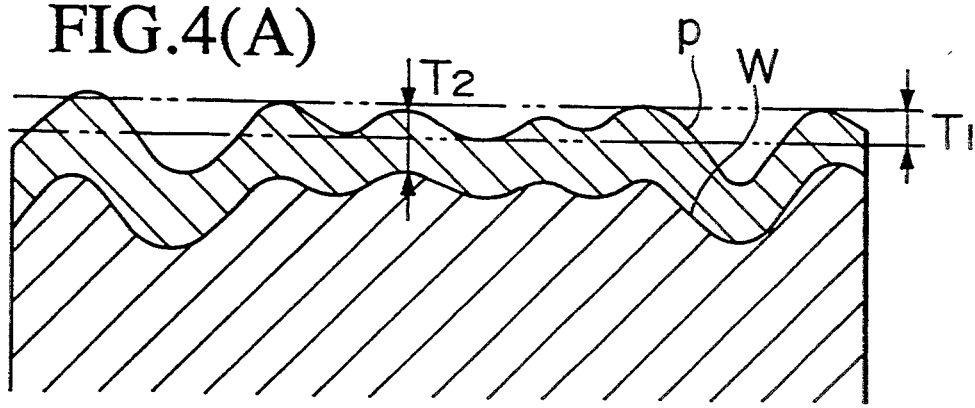
FIG. 4(A) is a view similar to FIG. 2(A), but showing a back surface of a wafer on which a polysilicon film is formed.
Figure 3:
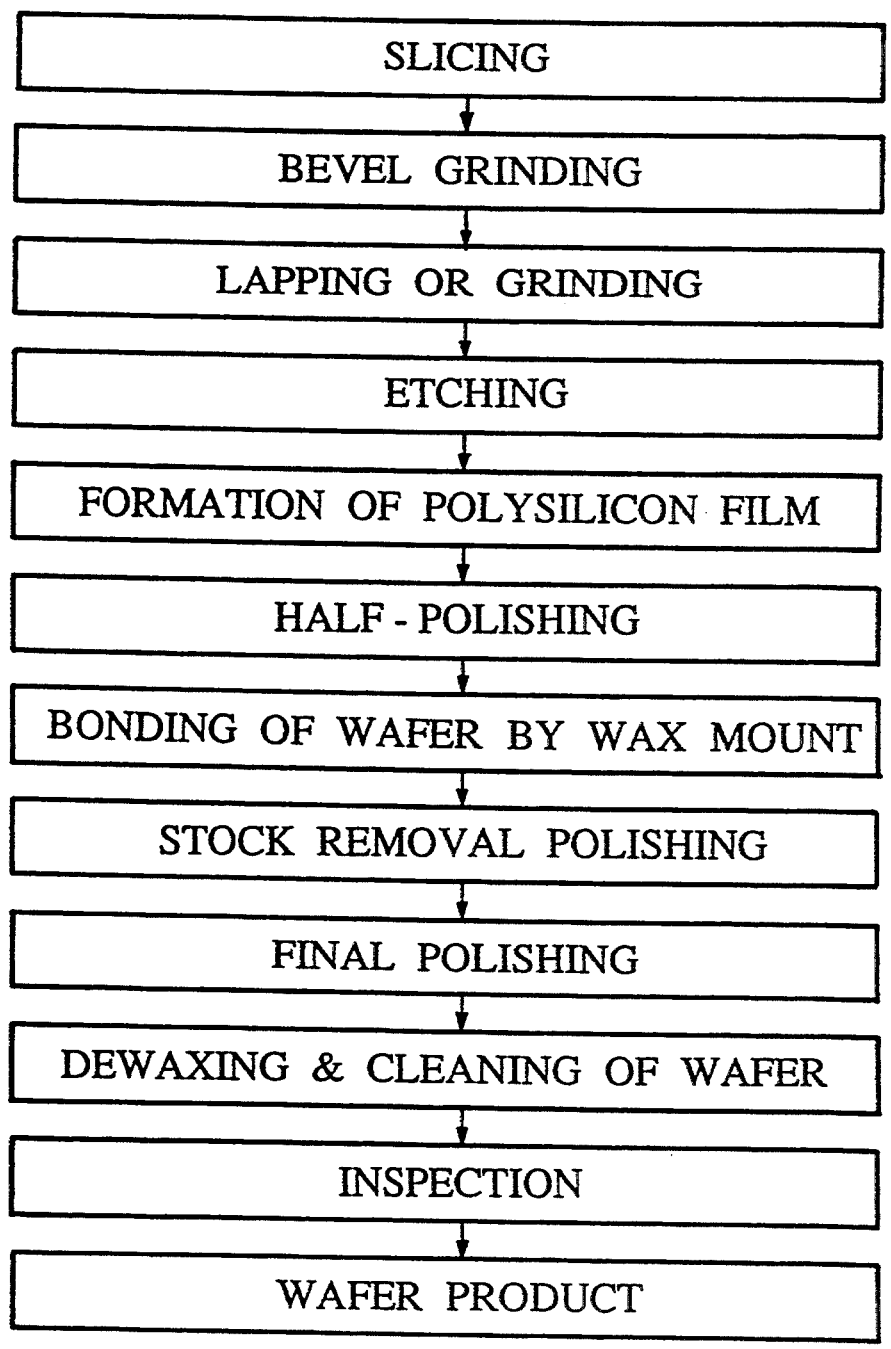
FIG. 3 is a view similar to FIG. 1, but showing a method of manufacturing a wafer in accordance with a second embodiment of the invention.

FIG. 3 depicts a flow diagram showing a wafer manufacturing method, in accordance with a second embodiment of the present invention. This modified method differs from that of the first embodiment in that a polysilicon film p for extrinsic gettering, is formed on the back surface of the wafer W between the etching step and the half-polishing step. More specifically, as schematically seen from FIG. 4(A), the polysilicon film p is vapor-deposited on the back surface of the etched wafer W by means of the CVD method so as to substantially copy after the ripple thereon to increase the degree of the ripple.

When polysilicon is vapor-deposited on the wafer by means of the CVD method, silicon particles and flakes produced in the CVD furnace may fall on the surface of the wafer during the deposition of the thin film, or there may occur an abnormal growth of the film starting from the polysilicon crystals which peel off from the contact portion of the wafer with a quartz plate, resulting in the formation of protrusions. These abnormal protrusions are usually crushed by a mound crusher on a bipolar epitaxial layer, but a large quantity of debris particles are generated and additionally scratch traces tend to be generated. When bonding the wafer to the carrier plate and polishing the same, dimple defects may become attributable to these protrusions or their scratch traces, and the flatness is deteriorated.

In the foregoing, it is preferable that the average thickness $T_2$ of the polysilicon film p range from 0.1 to 5 µm, more preferably from 0.5 to 2 µm. If the thickness is below 0.1 µm, the polysilicon film is partly oxidized and removed to expose a part of the single crystal, so that the extrinsic gettering effect is diminished. On the other hand, the thickness need not exceed 5 µm.

Figure 4B:
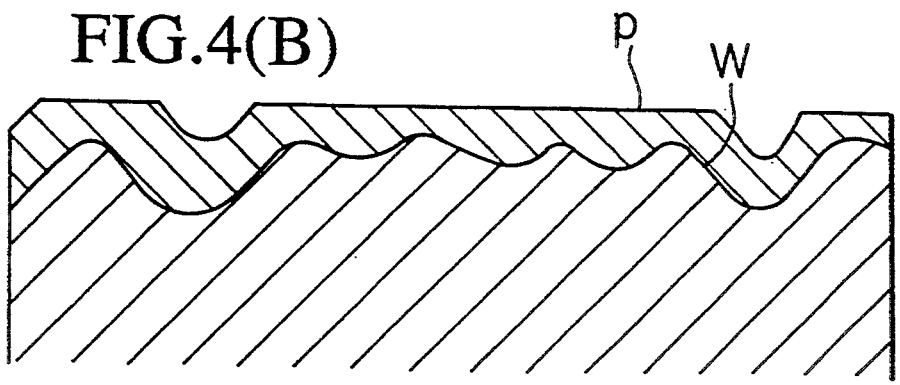
FIG. 4(B) is a view similar to FIG. 4(A), but showing the back surface of the wafer after the removal of ditches by a half-polishing treatment

Subsequently, as is the case with the previous embodiment, the wafer is fixedly placed on the upper polishing plate of the single wafer polishing machine, and the polishing pad is brought into abutment with the back surface of the wafer W. The polishing plates are then rotated relative to each other while supplying an alkaline polishing liquid containing fine polishing particles such as colloidal silica ($SiO_2$) to carry out a chemical mechanical polishing to half-polish the polysilicon film on the back surface of the wafer. FIG. 4B depicts an enlarged cross-sectional view of the back surface of the wafer W at a time of completion of the half-polishing work. Thus, in the case where the half-polishing is carried out after the formation of the polysilicon film, dimples are not identified.

With respect to the average amount of removal $T_1$ of the polysilicon film at the half-polishing work, around 0.02 to 0.1 µm are enough. With this construction, the average roughness Ra reduces to about a half, and the maximum roughness Rmax reduces to 2/3. Below 0.02 µm, the back surface contour is transferred to the front surface, and fine ditches are formed thereon. On the other hand, if the average amount of removal exceeds 0.1 µm, the polishing time is increased, and scratches may occur.

In the foregoing, the abutting pressure against the polishing pad, pH concentration of the polishing liquid, and the average particle size of the polishing particles may be identical to those in the manufacturing method of the first embodiment. However, inasmuch as the polishing rate for silicon is smaller than that for polysilicon, it is preferable that the aforesaid parameters be smaller or shorter than those in the previous embodiment.

Subsequently, the polysilicon film made flat by the half-polishing is bonded to the carrier plate of the polishing machine by adhesive such as wax. Then, the carrier plate is set on the polishing machine, and as is the case with that of the previous embodiment, mirror polishing operations (stock removal-polishing and final polishing operations) are carried out. After the final polishing is thus completed, the wafer is removed from the carrier plate, and after being cleaned and dried, the wafer is subjected to a prescribed quality inspection to obtain a wafer product.

According to the modified wafer-manufacturing method as described above, the dimples are prevented from occurring on the surface of the wafer during the mirror polishing operation by removing the protrusions on the polysilicon film by the half-polishing work, so that the flatness of the wafer can be enhanced over the entire surface thereof. Furthermore, since the wafer is secured to the carrier plate with the flattened back surface being secured to the carrier plate through wax for mirror-polishing, the flatness of the wafer is further improved. In addition, since the back surface is made flat, vacuum chucking in a flatness-inspecting instrument becomes stable. Moreover, the wave, which is recognized on the surface by a Makyo observation, can be avoided by removing the protrusions of the polysilicon film as well as the ripples, resembling a peak and valley, existing during the etching.

When the protrusions of the polysilicon film are removed, those portions of the protrusions where many granular crystals which tend to peel off to produce particles during the conveyance of the wafers are developed, are removed, and hence the proportion defective in the device process stemming from the occurrence of particles can be reduced. Accordingly, rigid requirements for the manufacture of the devices can be attained even in the manufacture of the wafers of a large size such as 200 mm wafers.

Incidentally, with respect to a specimen obtained by forming a polysilicon film and thereafter removing the protrusions on the film by half-polishing, the inventors have inspected the extrinsic gettering capability, and confirmed that the extrinsic gettering capability is of quite the same degree as that of the conventional wafer with a polysilicon film which is obtained without half-polishing. It is derived from this fact that the protrusions occurring on the polysilicon film does not contribute to the extrinsic gettering capability.

The present invention will now be illustrated in more detail by way of the following examples:

EXAMPLE 1

(1) Wafer-Manufacturing Method of First Embodiment:

A silicon single crystal ingot having a diameter of 8 inch was sliced into wafers of 0.8 mm thick, and both surfaces of the wafer were subjected to grinding as well as bevel grinding using a #2000 diamond grinding tool.

Figure 5:
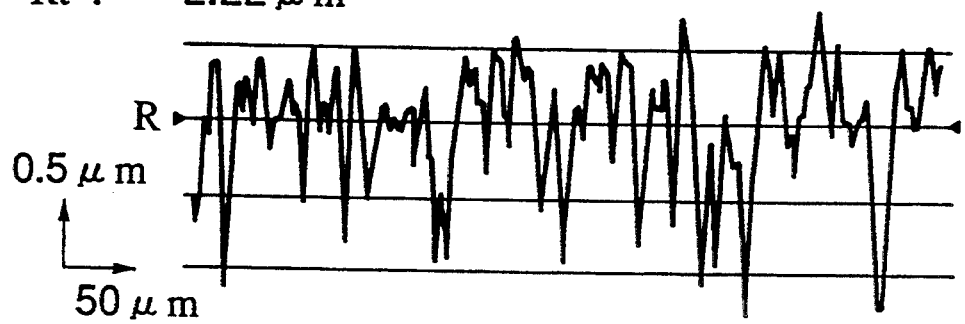
FIG. 5 is a graphical representation of an experimental result in an example corresponding to the first embodiment of the invention, showing the measurement of the surface roughness of an etched surface.

The aforesaid both surfaces of the wafer were immersed in an etchant ($HNO_3 + HF + CH_3COOH$) to remove the damaged layers thereon. The surface roughness of the wafer at the time of completion of etching was measured using a contact-type roughness gauge manufactured by Tokyo Seimitsu-Sha, and the results are set forth in FIG. 5. The average roughness, Ra, was 0.31 µm, while the maximum roughness, Rmax, was 2.22 µm.

Thereafter, half-polishing work was carried out on the back surface of the etched wafer. An alkaline polishing liquid (pH 10.5) containing $SiO_2$ particles of an average particle size of 0.02 µm was employed as a polishing liquid, and the abutting pressure against the polishing pad was 150 gf/cm$^2$. The polishing time was set to 2 minutes and 40 seconds. The thickness of the back surface portion of the wafer removed by the half-polishing work was measured on a Nanospeck thickness meter at nine points per wafer. The amount of removal averaged over six wafers was 0.04 µm.

Figure 6:
FIG. 6 is a graphical representation similar to FIG. 5, but showing the measurement of the surface roughness of an etched surface which is subjected to half-polishing treatment.

FIG. 6 depicts a graphical representation showing the surface roughness of the wafer after the half-polishing of the back surface, the roughness being measured by the aforesaid contact-type roughness gauge. The average roughness Ra was 0.16 µm, while the maximum roughness Rmax was 1.49 µm. As will be clear from the comparison of FIG. 6 with FIG. 5, although the protrusions above the center line were removed, the recesses remained unchanged. Hence, it is clear that the work schematically shown in FIG. 2(B) was carried out.

The back surface of the wafer thus flattened was bonded to the carrier plate of the polishing machine through wax, and the carrier plate was set on a polishing machine to effect stock-removal polishing and final polishing operations. The same alkaline polishing liquid as in the half-polishing, i.e., polishing liquid containing colloidal silica particles of an average particle size of 0.02 μm dispersed therein, was used for both the stock-removal polishing and final polishing operations. After the completion of the final polishing operation, the wafer was peeled off from the carrier plate, cleaned and dried to provide a wafer in accordance with the first embodiment of the invention.

(2) Wafer-Manufacturing Method of Second Embodiment:

The stone procedures as in the manufacturing method of the first embodiment were repeated up to the etching step.

Figure 7:
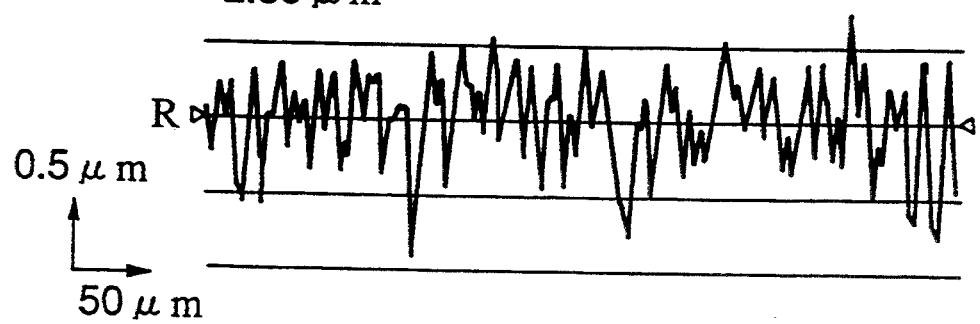
FIG. 7 is a graphical representation of an experimental result in an example corresponding to the second embodiment of the invention, showing the measurement of the surface roughness of an etched surface immediately after the formation of the polysilicon film.

Then, a polysilicon film was formed on the back surface of the etched wafer by the CVD method so as to have a thickness of 1.5 μm. FIG. 7 is a graphical representation showing the roughness of the polysilicon film on the etched wafer, the roughness being measured by the aforesaid roughness gauge. The average roughness Ra was 0.23 μm, while the maximum roughness Rmax was 2.37 μm. Due to the formation of the polysilicon film, the ripples became small on average, but since the depositing gas arrived more at the protrusions, the differences between peaks and valley portions became larger.

Figure 8:
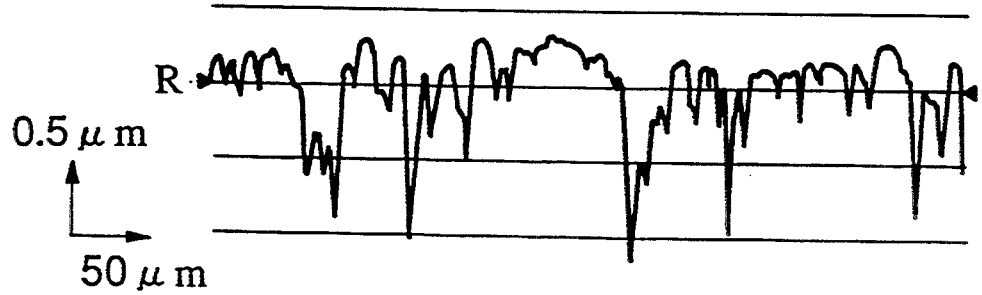
FIG. 8 is a graphical representation similar to FIG. 7, but showing the measurement of the surface roughness of an etched surface after the half-polishing treatment of the polysilicon film.

Then, half-polishing work was carried out on the polysilicon film on the back surface of the wafer. Thereafter, the surface roughness of the wafer was measured using the aforesaid contact-type roughness gauge. The results are set forth in FIG. 8, and the average roughness Ra was 0.19 μm while the maximum roughness Rmax was 1.50 μm. Similarly to the case where the back surface of the wafer was half-polished, the protrusions were removed by polishing. The conditions for the half-polishing work were set equal to those in the previous embodiment. Then, the subsequent procedures similar to those in the previous embodiment were repeated to produce a wafer in accordance with a second embodiment of the invention.

(3) Comparative Wafer-manufacturing Method:

Wafers were produced by a comparative method which differed from that of the first embodiment only in that the half-polishing work was not effected.

Figure 9:
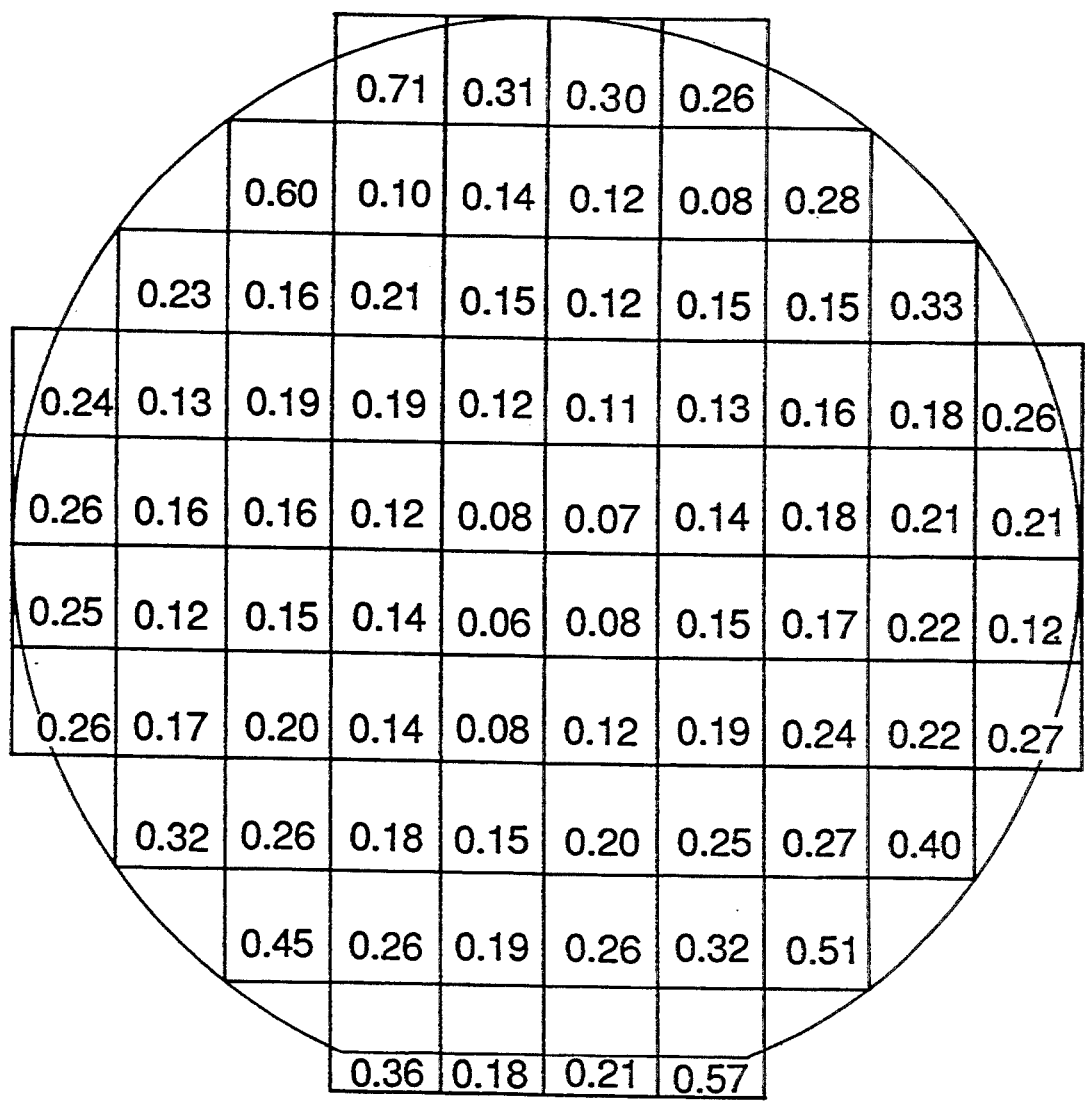
FIG. 9 is a diagrammatical representation of the experimental result in the example corresponding to the first embodiment of the invention, showing the measurement of flatness by Site Total Indicator Reading (STIR) on the half-polished back surface of the wafer.
Figure 12:
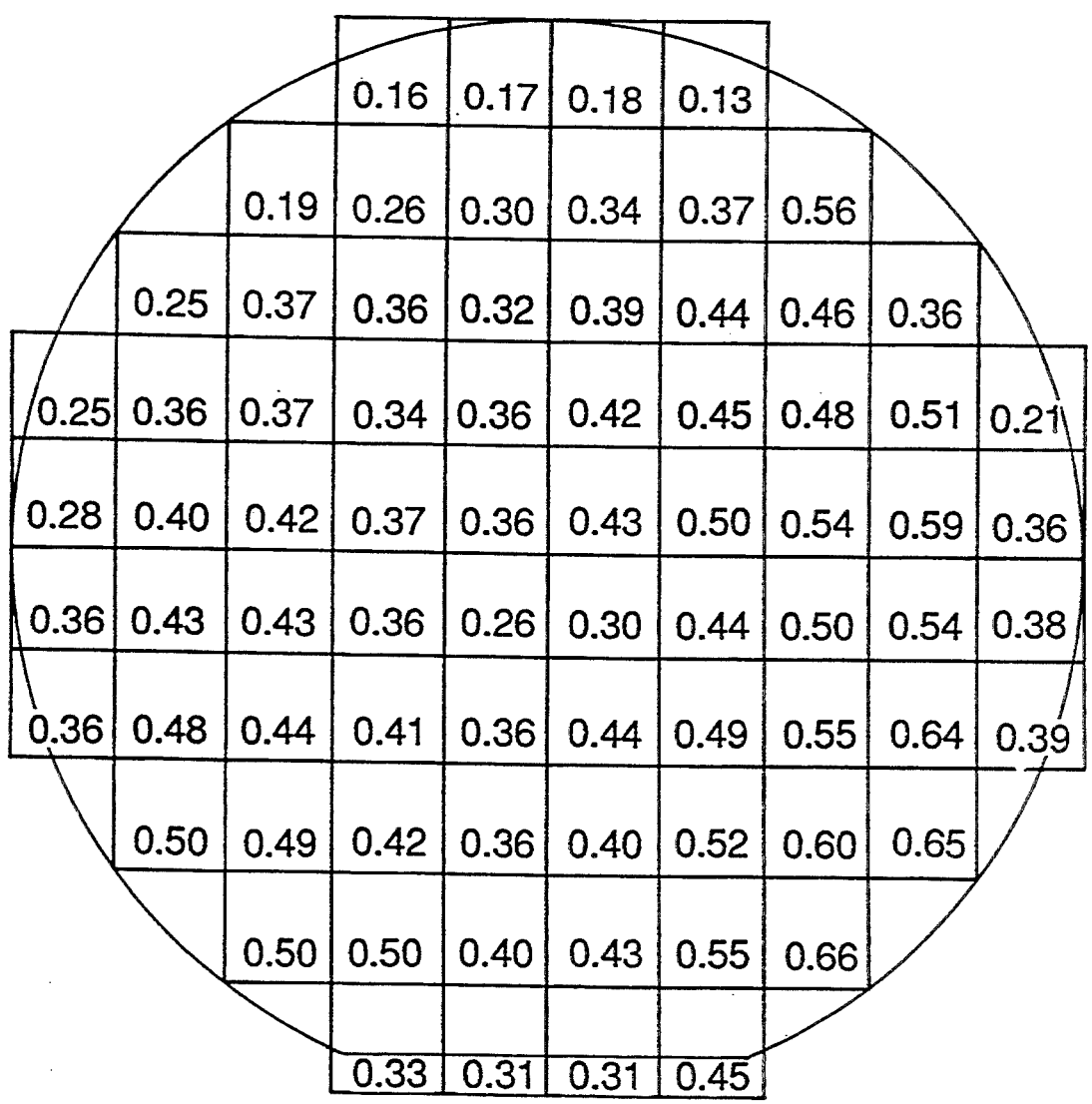
FIG. 12 is a view similar to FIG. 11, but showing the result in another comparative example, showing the flatness by STIR measurement on the wafer with polysilicon film.

(4) Comparison of Methods:

As to three kinds of wafers thus obtained, STIR (Site Total Indicator Reading: absolute value of the difference between maximal and minimal distances from a reference plane designated in a prescribed site) was measured over every site of 20 mm square on the wafer surface. Typical results obtained in conjunction with the method of the first embodiment are set forth in FIG. 9, while the wafers obtained by the method of the second embodiment shown in FIG. 10. In addition, the results in conjunction with the comparative method are shown in FIGS. 11 and 12.

EXAMPLE 2

The three kinds of wafers obtained in Example 1 as well as a particle-monitoring wafer which does not generate COP (Crystal Oriented Particle) were immersed in pure water and arranged in a wafer cassette so as to be opposed to each other, and ultrasonic wave was directed thereon for ten minutes to measure the amount of particles generated.

The three kinds of wafers were dried and measured as to the particles of 0.13 μm using a particle counter (Model LS6000). As a result, in the wafers produced by the manufacturing methods of the invention, 500 to 1,000 particles per wafer were detected while in the wafer obtained by the comparative method, 10,000 to 100,000 particles per wafer were detected. Thus, it is clear that according to the methods of the invention, less particles were generated.

EXAMPLE 3

In order to investigate whether or not the gettering capability is diminished by the half-polishing work, a solution containing 10 ppm of copper ions was applied to the surfaces of each wafer to cause copper atoms to adhere thereon, and each wafer was heat-treated at 900° C. SIMS (Secondary Ion Mass Spectroscopy) analysis was carried out as to the surface of the resulting wafer, but no copper was recognized in any of the three wafers.

Obviously, many modifications and variations of the present invention are possible in the light of the above teachings. It is therefore to be understood that within the scope of the appended claims, the invention may be practiced otherwise than as specifically described.

Finally, the present application claims the priority of Japanese Patent Application No. 4-250126 filed on Sep. 18, 1992, which is herein incorporated by reference.

What is claimed is:

1. A method of manufacturing a wafer, comprising the steps of:
   (a) slicing a single crystal ingot into a plurality of wafers each having front and back surfaces, and subjecting said front and back surfaces of each wafer to one of grinding operation or lapping operation;
   (b) subsequently subjecting said front and back surfaces of said wafer to etching;
   (c) subsequently subjecting said back surface of said wafer to chemical mechanical polishing to partially polish the back surface to an incomplete mirror polished finish; and
   (d) thereafter, placing said wafer on a polishing device, with said partially polished back surface being adhered to a carrier plate of said polishing device, and subjecting said front surface of said wafer to mirror polishing.

2. A method of manufacturing a wafer, according to claim 1, wherein said chemical mechanical polishing step (c) includes carrying out polishing, while supplying an alkaline polishing liquid containing polishing particles therein, at an abutting pressure of 50 to 400 gf/cm$^2$, and pH concentration of 10 to 11, said polishing particles having an average particle size ranging from 0.01 to 0.02 μm.

3. A method of manufacturing a wafer, according to claim 1, wherein said chemical mechanical polishing step includes removing said back surface of said wafer in an average amount of removal of 0.01 to 0.2 μm.

4. A method of manufacturing a wafer according to claim 1, further comprising the step of forming a polysilicon film on said back surface of said wafer between said etching step (b) and said chemical mechanical polishing step (c).

5. A method of manufacturing a wafer, according to claim 4, wherein said step of forming the polysilicon film includes forming said polysilicon film so as to have a thickness ranging from 0.1 to 5 μm, said chemical mechanical polishing step (c) including removing the polysilicon film formed on the back surface of the wafer in an average amount of removal of 0.02 to 0.1 μm.

* * * * *